(12) United States Patent
Umeda et al.

(10) Patent No.: US 11,404,353 B2
(45) Date of Patent: Aug. 2, 2022

(54) ELECTRONIC DEVICE, CONNECTION BODY, AND MANUFACTURING METHOD FOR ELECTRONIC DEVICE

(71) Applicant: SHINDENGEN ELECTRIC MANUFACTURING CO., LTD., Tokyo (JP)

(72) Inventors: Soichiro Umeda, Hanno (JP); Yuji Morinaga, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 558 days.

(21) Appl. No.: 15/751,845

(22) PCT Filed: Feb. 20, 2017

(86) PCT No.: PCT/JP2017/006029
§ 371 (c)(1),
(2) Date: Feb. 9, 2018

(87) PCT Pub. No.: WO2018/150558
PCT Pub. Date: Aug. 23, 2018

(65) Prior Publication Data
US 2020/0219797 A1    Jul. 9, 2020

(51) Int. Cl.
*H01L 23/48* (2006.01)
*H01L 23/482* (2006.01)
(Continued)

(52) U.S. Cl.
CPC .......... *H01L 23/4828* (2013.01); *H01L 23/31* (2013.01); *H01L 23/49513* (2013.01);
(Continued)

(58) Field of Classification Search
CPC combination set(s) only.
See application file for complete search history.

(56) References Cited

U.S. PATENT DOCUMENTS 6,249,041 B1    6/2001    Kasem et al.
6,307,755 B1    10/2001    Williams et al.
(Continued)

FOREIGN PATENT DOCUMENTS

| CN | 105359262 A | 2/2016 |
| JP | 58-119665 A | 7/1983 |

(Continued)

OTHER PUBLICATIONS

Extended European Search Report from EP app. no. 17838112.5, dated Aug. 8, 2020.
(Continued)

*Primary Examiner* — Moin M Rahman
(74) *Attorney, Agent, or Firm* — Ladas & Parry, LLP

(57) ABSTRACT

An electronic device has a sealing part 90, a first terminal 11 projecting outward from a first side surface of the sealing part 90, a second terminal 13 projecting outward from a second side surface different from the first side surface of the sealing part 90, an electronic element 95 provided inside the sealing part 90, and a head part 40 coupled to the first terminal 11 and the second terminal and connected to a front surface of the semiconductor element 95 via a conductive adhesive 75.

5 Claims, 9 Drawing Sheets

(51) Int. Cl.
*H01L 23/31* (2006.01)
*H01L 23/495* (2006.01)
*H01L 23/00* (2006.01)

(52) U.S. Cl.
CPC ........ *H01L 23/49541* (2013.01); *H01L 24/05* (2013.01); *H01L 24/48* (2013.01); *H01L 2224/48091* (2013.01); *H01L 2224/48247* (2013.01)

(56) References Cited

U.S. PATENT DOCUMENTS

| | | | |
|---|---|---|---|
| 2004/0089928 A1* | 5/2004 | Nakajima | H01L 23/4334 257/E23.044 |
| 2012/0306299 A1 | 12/2012 | Masuzawa et al. | |
| 2013/0241047 A1 | 9/2013 | Omae et al. | |
| 2013/0264696 A1 | 10/2013 | Kajiwara et al. | |
| 2015/0087114 A1 | 3/2015 | Xue et al. | |
| 2016/0079221 A1 | 3/2016 | Inokuchi et al. | |
| 2016/0307854 A1* | 10/2016 | Matsubara | H01L 24/85 |
| 2017/0025331 A1* | 1/2017 | Kamiyama | H01L 21/4842 |
| 2018/0026022 A1* | 1/2018 | Lee | H01L 23/5383 257/659 |

FOREIGN PATENT DOCUMENTS

| | | |
|---|---|---|
| JP | 63-73946 | 5/1988 |
| JP | 10-294473 A | 11/1998 |
| JP | 11-354702 A | 12/1999 |
| JP | 2012-249457 A | 12/2012 |
| JP | 2015-12065 A | 1/2015 |

OTHER PUBLICATIONS

International Search Report for PCT/JP2017/00602, dated Apr. 25, 2017, and its English translation provided by WIPO.
International Preliminary Examination Report for PCT/JP2017/00602, dated Sep. 13, 2017, and its English translation provided by Google Translator.
First Office Action from CN app. No. 201780003204.2, dated Jun. 30, 2021, with English translation from Global Dossier.
Communication pursuant to Article 94(3) EPC from EP app. No. 17838112.5, dated Jan. 25, 2022, all pages.

* cited by examiner

ELECTRONIC DEVICE, CONNECTION BODY, AND MANUFACTURING METHOD FOR ELECTRONIC DEVICE

CROSS-REFERENCE TO RELATED APPLICATIONS

The present application is the U.S. national phase of PCT Application PCT/JP2017/006029 filed on Feb. 20, 2017, the disclosure of which is incorporated herein by reference.

TECHNICAL FIELD

The present invention relates to an electronic device, a connection body, and a manufacturing method for electronic device.

BACKGROUND ART

Conventionally, a semiconductor element is placed on a conductor layer of a substrate, and a front surface of the semiconductor element and a terminal are connected to each other with a wire or a connector via a conductive adhesive such as solder (refer to JP 2015-12065 A). There is no small need for applying large-capacity current into the semiconductor device, and it is conceivable to use a plurality of wires in order to increase flowing current; however, a manufacturing step becomes complicated. For this reason, it is conceivable to adopt a connector having a large width, but since the connector having a large width has a heavy weight, the conductive adhesive such as solder provided on the front surface of the semiconductor element problematically becomes thin by its own weight.

SUMMARY OF INVENTION

Technical Problem

In view of the above, the present invention provides a highly-reliable electronic device in which the thickness of the conductive adhesive is secured while using an appropriate amount of conductive adhesive, and a connection body used in such electronic device.

Solution to Problem

An electronic device according to an example of the present invention comprises:
a sealing part;
a first terminal projecting outward from a first side surface of the sealing part;
a second terminal projecting outward from a second side surface different from the first side surface of the sealing part;
an electronic element provided inside the sealing part; and
a head part coupled to the first terminal and the second terminal and connected to a front surface of the electronic element via a conductive adhesive.

In the electronic device according to the example of the present invention,
the first terminal and the second terminal may extend in opposite directions from the head part.

In the electronic device according to the example of the present invention,
the electronic element may have a withstand voltage structure,
the electronic device may further comprise:
a first avoiding part, provided between the first terminal and the head part, for avoiding contact with the withstand voltage structure; and
a second avoiding part, provided between the second terminal and the head part, for avoiding contact with the withstand voltage structure.

In the electronic device according to the example of the present invention,
the first avoiding part may be a first concave part concaved so as to be separated from the electronic element and the second avoiding part may be a second concave part concaved so as to be separated from the electronic element.

In the electronic device according to the example of the present invention,
the first terminal may be a power terminal, and the second terminal may be a sensing terminal.

In the electronic device according to the example of the present invention,
a back surface side height of the first terminal may correspond to a back surface side height of the second terminal.

In the electronic device according to the example of the present invention,
the head part may be integrally formed with the first terminal and the second terminal.

A connection body; according to an example of the present invention, used in an electronic device having a sealing part and an electronic element provided inside the sealing part, comprises:
a first terminal projecting outward from a first side surface of the sealing part;
a second terminal projecting outward from a second side surface different from the first side surface of the sealing part; and
a head part coupled to the first terminal and the second terminal and connected to a front surface of the electronic element.

A manufacturing method for an electronic device, according to an example of the present invention, comprises;
a step of preparing a sealing part, a first terminal for projecting outward from a first side surface of the sealing part, a second terminal for projecting outward from a second side surface different from the first side surface of the sealing part, and a head part coupled to the first terminal and the second terminal and for being connected to a front surface of an electronic element via a conductive adhesive;
a step of placing the conductive adhesive on the electronic element; and
a step of placing the first terminal and the second terminal on a jig so that the head part is connected to the front surface of the electronic element via the conductive adhesive.

Effects of Invention

In this invention, the first terminal and the second terminal extending in the direction different from that of the first terminal are coupled to the head part, so that the first terminal and the second terminal can be utilized as jig receivers. Therefore, it is possible to prevent the thickness of the conductive adhesive such as solder provided on the front surface of the electronic element from becoming thin due to a weight of the connecting unit by adjusting the heights of the back surface of the first terminal and the back surface of the second terminal by using jig and the like and sealing the same with the sealing resin and the like.

DESCRIPTION OF EMBODIMENTS

Embodiment

<Configuration>

Figure 1:
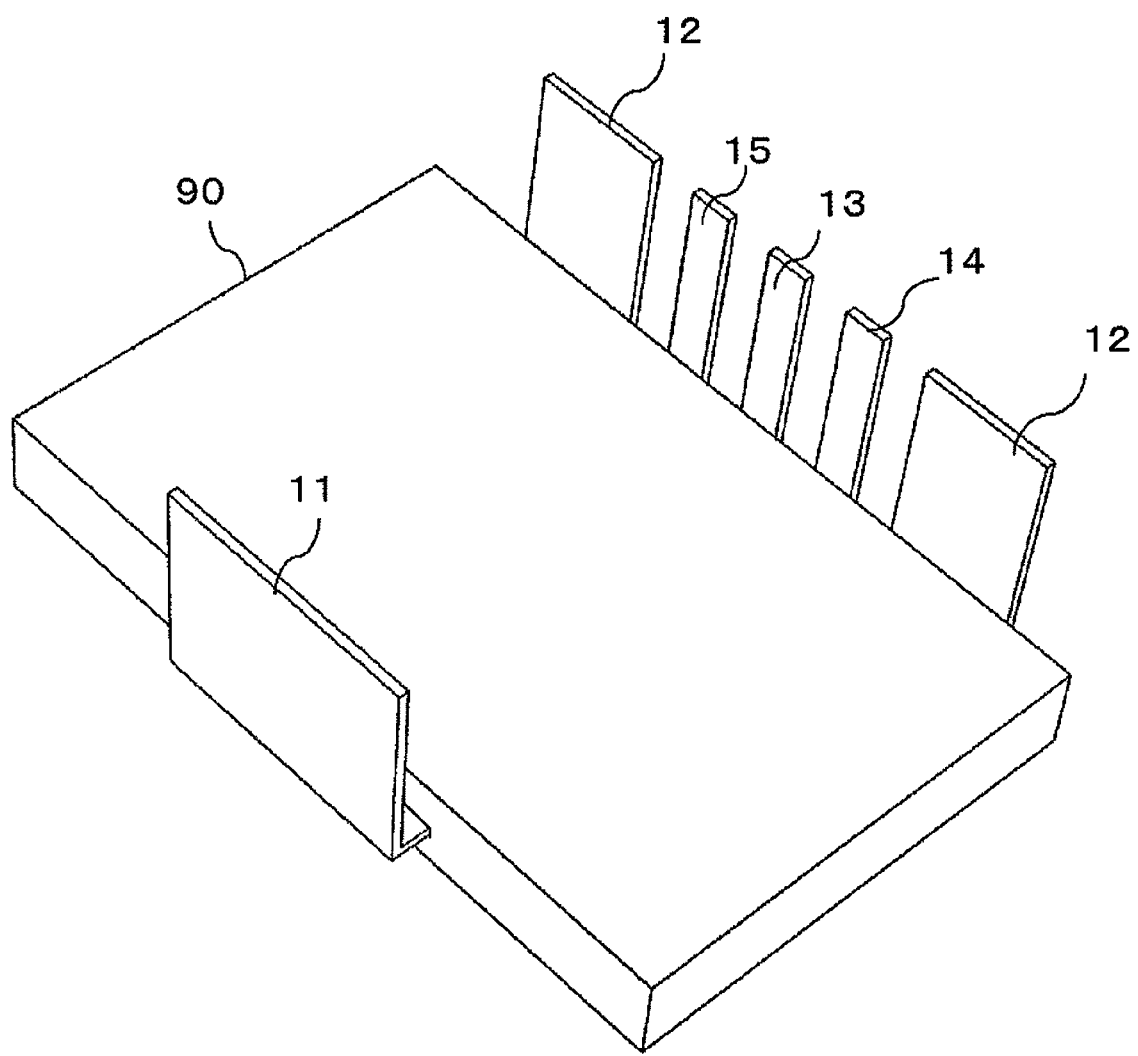
FIG. 1 is a perspective view of a semiconductor device according to an embodiment of the present invention.
Figure 2:
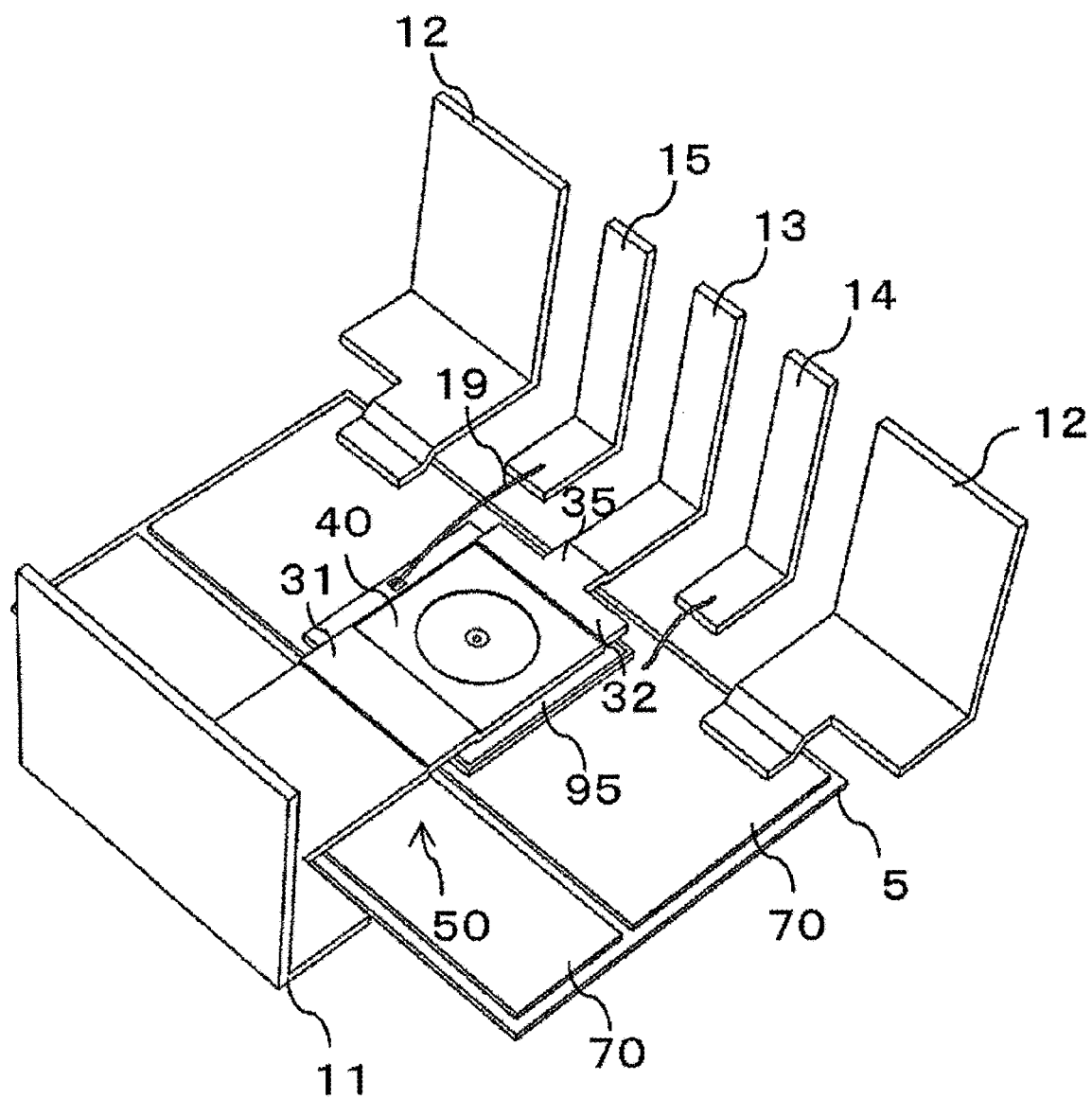
FIG. 2 is a perspective view illustrating an aspect in which a sealing part is removed in the semiconductor device according to the embodiment of the present invention.

As illustrated in FIG. 2, a semiconductor device being an example of an electronic device of this embodiment may have a sealing part 90 (refer to FIG. 1) made of a sealing resin and the like, a first main terminal 11 being a first terminal projecting outward from a first side surface of the sealing part 90, a sensing terminal 13 being a second terminal projecting outward from a second side surface different from the first side surface of the sealing part 90, a semiconductor element 95 provided inside the sealing part 90, and a head part 40 coupled to the first main terminal 11 and the sensing terminal 13 and connected to a front surface of the semiconductor element 95 via a conductive adhesive 75. In this embodiment, the first main terminal 11 through which main current flows is described as the first terminal, and the sensing terminal 13 on a front surface side used for sensing on a source side (hereinafter referred to as "front surface side sensing terminal 13") is described as the second terminal, but there is no limitation. It is also possible to adopt an aspect in which the main current does not flow through the first terminal or to use an aspect in which the second terminal is not used for the sensing. Also, in this embodiment, "coupled" also includes an "integrated" aspect.

Although the semiconductor device is used as the electronic device, and the semiconductor element 95 is described as an electronic element in this embodiment, there is no limitation, and a "semiconductor" is not especially required.

The semiconductor device of this embodiment also has a second main terminal 12 projecting outward from the sealing part 90 through which the main current flows. The semiconductor element 95 illustrated in FIG. 2 is such that the front surface is electrically connected to the first main terminal 11 and a back surface is electrically connected to the second main terminal 12. In this embodiment, the head part 40 and the first main terminal 11 may be integrally formed, or the head part 40 and the front surface side sensing terminal 13 may be integrally formed with a connecting unit 35. Also, the first main terminal 11, the head part 40, the connecting unit 35, and the front surface side sensing terminal 13 may be integrally formed in this order.

Figure 9:
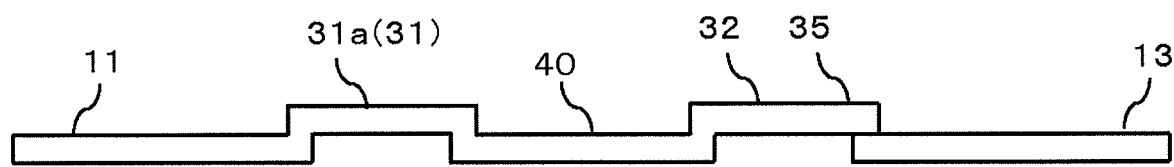
FIG. 9 is a side view illustrating an aspect in which a connecting unit and the front surface side sensing terminal are separated.

Also, it is not limited to such an aspect; for example, the connecting unit 35 and the head part 40 are integrally formed, but the connecting unit 35 and the front surface side sensing terminal 13 may be separately formed. As an example, as illustrated in FIG. 9, a back surface of the connecting unit 35 may be coupled to a front surface of the front surface side sensing terminal 13 via a conductive adhesive and the like. Also, the first main terminal 11 and the head part 40 are originally separated from each other and may be coupled to each other by using the conductive adhesive 75 and the like.

Figure 4:
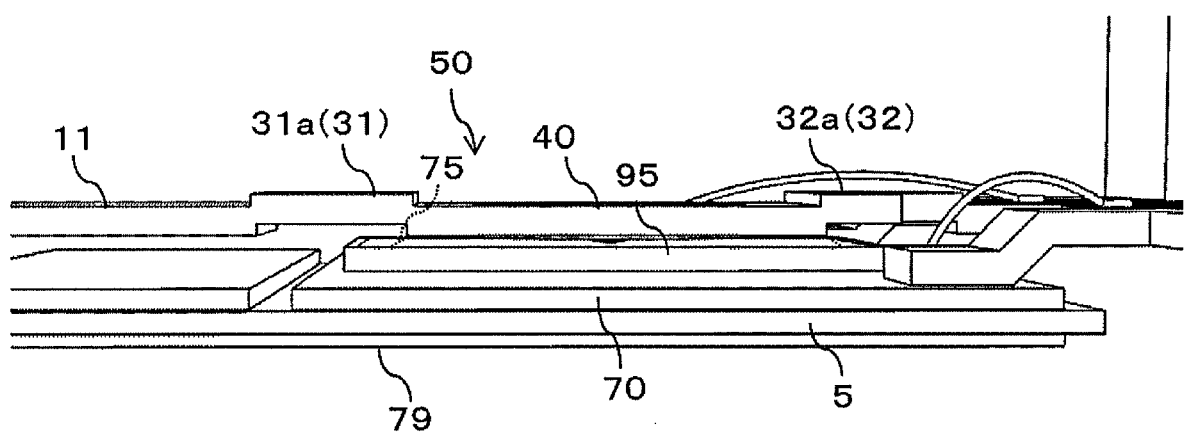
FIG. 4 is an enlarged side view of FIG. 3.

As illustrated in FIG. 2, the semiconductor device may have, for example, a substrate 5 made of an insulating material and a conductor layer 70 made of copper and the like provided on the substrate 5. In an aspect illustrated in FIG. 2, the second main terminal 12 is connected to the conductor layer 70, and the second main terminal 12 is connected to the back surface of the semiconductor element 95 via the conductor layer 70. A resist (not illustrated) may also be provided on a peripheral edge of a connecting portion of the second main terminal 12 to the conductor layer 70 in order to prevent the conductive adhesive such as solder from flowing. The back surface of the semiconductor element 95 and the conductor layer 70 may also be connected via the conductive adhesive such as solder. The head part 40 and the front surface of the semiconductor element 95 may also be connected to each other via the conductive adhesive 75 such as solder (refer to FIG. 4). Also, a heat radiation plate 79 made of copper and the like may be provided on a back surface of the substrate 5.

Figure 6:
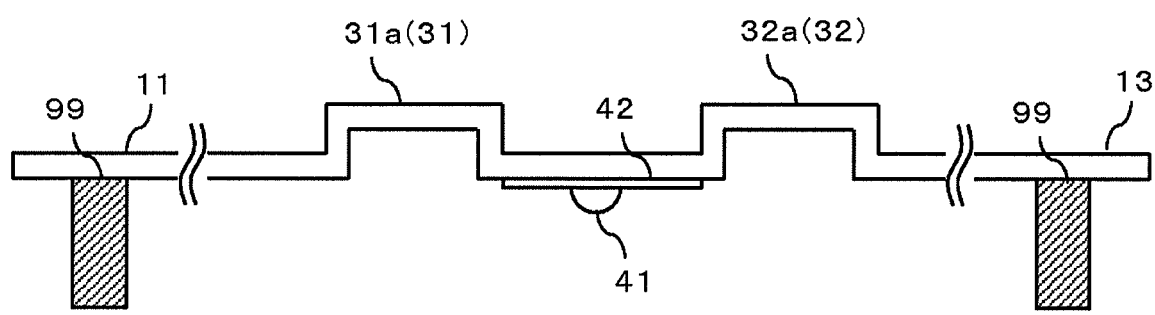
FIG. 6 is a side view illustrating a first example of a relationship of the head part, the avoiding part, a first main terminal, a front surface side sensing terminal and the like used in the embodiment of the present invention.
Figure 7:
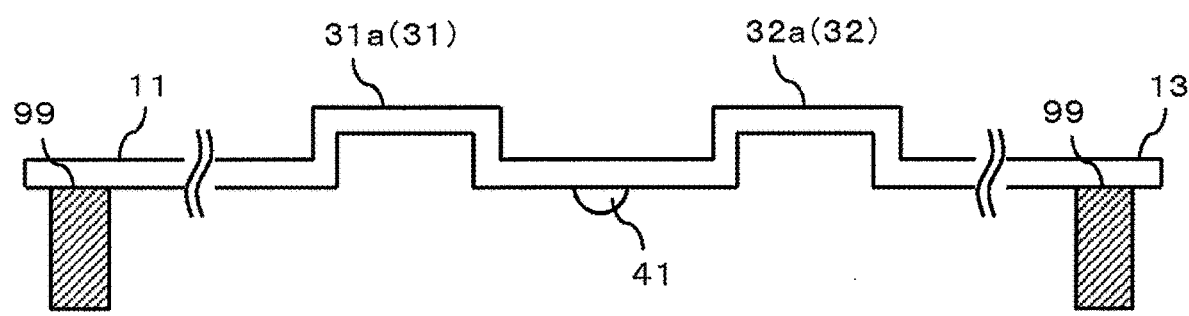
FIG. 7 is a side view illustrating a second example of the relationship of the head part, the avoiding part, the first main terminal, the front surface side sensing terminal and the like used in the embodiment of the present invention.
Figure 8:
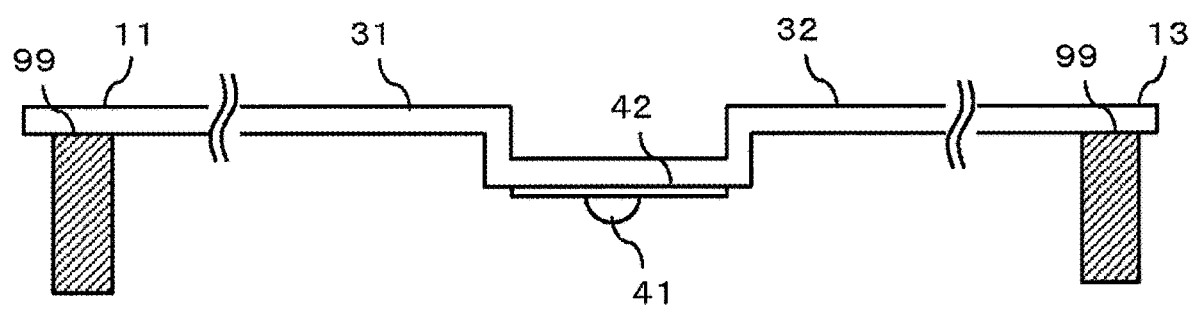
FIG. 8 is a side view illustrating a third example of the relationship of the head part, the avoiding part, the first main terminal, the front surface side sensing terminal and the like used in the embodiment of the present invention.

The semiconductor element 95 may have a withstand voltage structure such as a guard ring. In a case where the semiconductor element 95 has such withstand voltage structure, avoiding parts 31 and 32 formed integrally with the head part 40 for avoiding contact with the withstand voltage structure may be provided as illustrated in FIGS. 6 to 8. Such avoiding parts 31 and 32 are provided corresponding to the withstand voltage structure of the semiconductor element 95 and designed in advance on the basis of an arrangement position of the withstand voltage structure such as the guard ring, a thickness in a planar direction thereof and the like.

The avoiding parts 31 and 32 may have a first avoiding part 31 provided between the first main terminal 11 and the head part 40 and a second avoiding part 32 provided between the front surface side sensing terminal 13 and the head part 40. The first avoiding part 31 may be a first concave part 31a concaved so as to be separated from the semiconductor element 95 and the second avoiding part 32 may be a second concave part 32a concaved so as to be separated from the semiconductor element 95.

The first main terminal 11 and the second main terminal 12 may be power terminals through which large-capacity current flows.

The conductor layer 70 may not be provided below the first main terminal 11, the first avoiding part 31 may be exposed outside from the side surface of the sealing part 90 in the middle of the first avoiding part 31, and the first main terminal 11 may be exposed outside from the side surface of the sealing part 90 just after the first avoiding part 31.

In a case where the first main terminal 11 and the head part 40 are integrally formed and the front surface side sensing terminal 13, the connecting unit 35, and the head part 40 are integrally formed, a back surface side height of the first main terminal 11 may correspond to a back surface side height of the front surface side sensing terminal 13 as illustrated in FIGS. 6 to 8. Herein, when the heights correspond to each other, this means that they coincide with each other with difference within a range of 10% of a thickness of a thicker terminal out of the first main terminal 11 and the front surface side sensing terminal 13. In a case where a thickness $T_0$ of the first main terminal 11 and that of the front surface side sensing terminal 13 are the same, difference between the back surface side height of the first main terminal 11 and the back surface side height of the second main terminal 12 is not larger than 10% of the thickness $T_0$, which means that this is not larger than 0.1 $T_0$. In a case where the thicknesses of the first main terminal 11 and the front surface side sensing terminal 13 are different from each other, the difference therebetween is not larger than 10% of a thickness $T_1$ of the thicker one, which means that this is not larger than 0.1 $T_1$. The back surface side height of the first main terminal 11 and the back surface side height of the front surface side sensing terminal 13 may coincide with each other. In a case of coincidence, this means that the difference between the back surface side height of the first main terminal 11 and the back surface side height of the front surface side sensing terminal 13 is within a manufacturing error range.

Also, in a case where the first main terminal 11 and the head part 40 are integrally formed and the connecting unit 35 and the head part 40 are integrally formed as illustrated in FIG. 9, the back surface side height of the first main terminal 11 and the back surface side height of the front surface side sensing terminal 13 coupled to the connecting unit 35 may correspond to each other. Herein, when the heights correspond to each other, this means that they coincide with each other with difference within a range of 10% of the thickness of the thicker terminal out of the first main terminal 11 and the front surface side sensing terminal 13 as in the above-described aspect. The back surface side height of the first main terminal 11 and the back surface side height of the front surface side sensing terminal 13 may coincide with each other. In a case of coincidence, this means that the difference between the back surface side height of the first main terminal 11 and the back surface side height of the front surface side sensing terminal 13 is within a manufacturing error range.

The front surface side sensing terminal 13 and the connecting unit 35, and the first main terminal 11 may be provided so as to extend in opposite directions from the head part 40. It is sufficient that the front surface side sensing terminal 13 and the connecting unit 35, and the first main terminal 11 extend in the different directions as seen from the head part 40, and there is no limitation. For example, the front surface side sensing terminal 13 and the connecting unit 35, and the first main terminal 11 may extend so as to form an angle (obtuse angle) of 90 degrees or larger.

Figure 5:
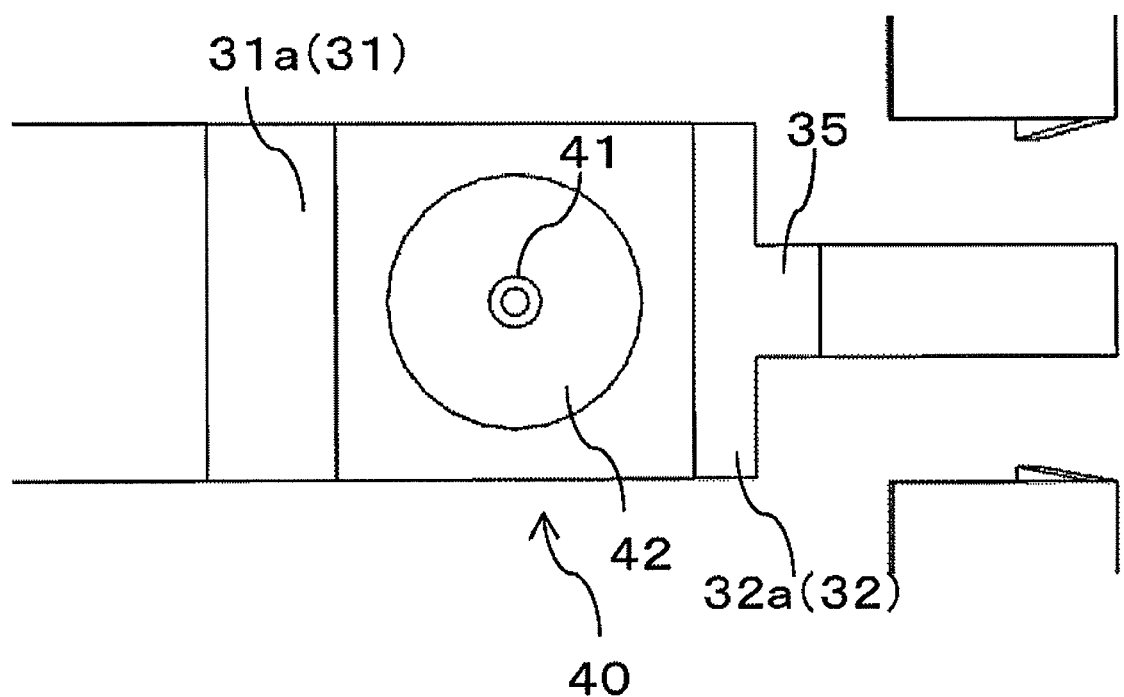
FIG. 5 is a bottom view illustrating a relationship of a head part, an avoiding part and the like used in the embodiment of the present invention.

As illustrated in FIGS. 5, 6, and 8, the head part 40 may have a second convex part 42 projecting toward the semiconductor element 95 and a first convex part 41 projecting from the second convex part 42 toward the semiconductor element 95. As illustrated in FIG. 7, the second convex part 42 may not be provided and only the first convex part 41 may be provided.

In the aspect illustrated in FIG. 2, as an example, widths of the first avoiding part 31, the head part 40, and the second avoiding part 32 are larger than widths of the front surface side sensing terminal 13 and the connecting unit 35, and widths of the first main terminal 11 and the second main terminal 12 are larger than the widths of the first avoiding part 31, the head part 40, and the second avoiding part 32.

Regarding a sensing current path, it is not necessary to apply large-capacity current, so that the widths of the second avoiding part 32, the connecting unit 35, and the front surface side sensing terminal 13 may be narrow. As an example, the width of each of the second avoiding part 32, the connecting unit 35, and the front surface side sensing terminal 13 is narrowed; this may be one-third or less, or one-fifth or less of the width of the head part 40. Meanwhile, in the aspect illustrated in FIG. 2, the width of the second avoiding part 32 on a side of the head part 40 is large, but such aspect is not needed. However, it is possible to surely secure the width of the planar-shaped head part 40 of the second avoiding part 32 by making the width of the second avoiding part 32 on the head part 40 side large and allowing the width of the head part 40 side to correspond to the width of the head part 40 as illustrated in FIG. 2. That is, when forming the head part 40, the second avoiding part 32 and the like, it is conceivable to punch out a conductive member such as a copper plate, but from a viewpoint of surely securing the width of the head part 40, it is preferable that the width of the second avoiding part 32 adjacent to the head part 40 is made approximately the same as the width of the head part 40. On the other hand, in a case of sacrificing the width of the head part 40 to some extent, it is conceivable to make the width of an entire second avoiding part 32 narrow.

In an aspect illustrated in FIG. 1, the second main terminal 12, the front surface side sensing terminal 13, a back surface side sensing terminal 14, and a control terminal 15 project from outside from the side surface on one side of the sealing part 90, and the first main terminal 11 projects outward from the side surface on the other side of the sealing part 90. The first main terminal 11, the second main terminal 12, the front surface side sensing terminal 13, the back surface side sensing terminal 14, and the control terminal 15 are bent toward the front surface side to be connected to the control substrate 5 provided on the front surface side. The control substrate 5 is used for controlling the semiconductor element 95.

An inner structure of the sealing part 90 of the semiconductor device may be line-symmetric. As an example, each of the first main terminal 11, the second main terminal 12, the front surface side sensing terminal 13, the back surface side sensing terminal 14, the control terminal 15, and the conductor layer 70 may be arranged so as to be symmetric with respect to an arbitrary straight line. Meanwhile, a wire 19 is also illustrated in FIG. 2.

Operations and Effects

Operations and effects according to this embodiment having the above-described configuration are next described.

In this embodiment, as illustrated in FIG. 2 and the like, the first main terminal 11 being the first terminal and the front surface side sensing terminal 13 being the second terminal extending in the direction different from that of the first terminal are coupled to the head part 40, so that the first main terminal 11 and the front surface side sensing terminal 13 can be utilized as jig receivers. Therefore, it is possible to prevent the thickness of the conductive adhesive 75 such as solder provided on the front surface of the semiconductor element 95 from becoming thin due to a weight of the connecting unit 35 by adjusting the heights of the back surface of the first main terminal 11 and the back surface of the front surface side sensing terminal 13 by using jigs 99 and the like and sealing the same with the sealing resin and the like as illustrated in FIGS. 6 to 8.

In a case where the aspect in which the front surface side sensing terminal 13, the connecting unit 35, and the head part 40 are integrally formed is adopted as illustrated in FIG. 2 and the like, it is possible to prevent height positions thereof from changing due to the coupling aspect of the front surface side sensing terminal 13 and the connecting unit 35 and to more accurately adjust the height by the jig 99 and the like. Therefore, an appropriate amount of the conductive adhesive 75 can be positioned between the front surface of the semiconductor element 95 and the head part 40, so that it is possible to more surely prevent cracking and the like due to a thinned thickness of the conductive adhesive 75. In a case of adopting an aspect in which the first main terminal 11 and the head part 40 are integrally formed also, it is possible to prevent the height positions thereof from changing due to the coupling aspect of the first main terminal 11 and the head part 40 and the height adjustment by the jig 99 and the like can be performed more accurately.

Also in a case where the head part 40 and the connecting unit 35 are integrally formed, and the connecting unit 35 and the front surface side sensing terminal 13 are separately formed as illustrated in FIG. 9, it is possible to prevent the height positions thereof from changing due to the coupling aspect of the head part 40 and the connecting unit 35 and to more accurately adjust the height by the jig 99 and the like.

Figure 3:
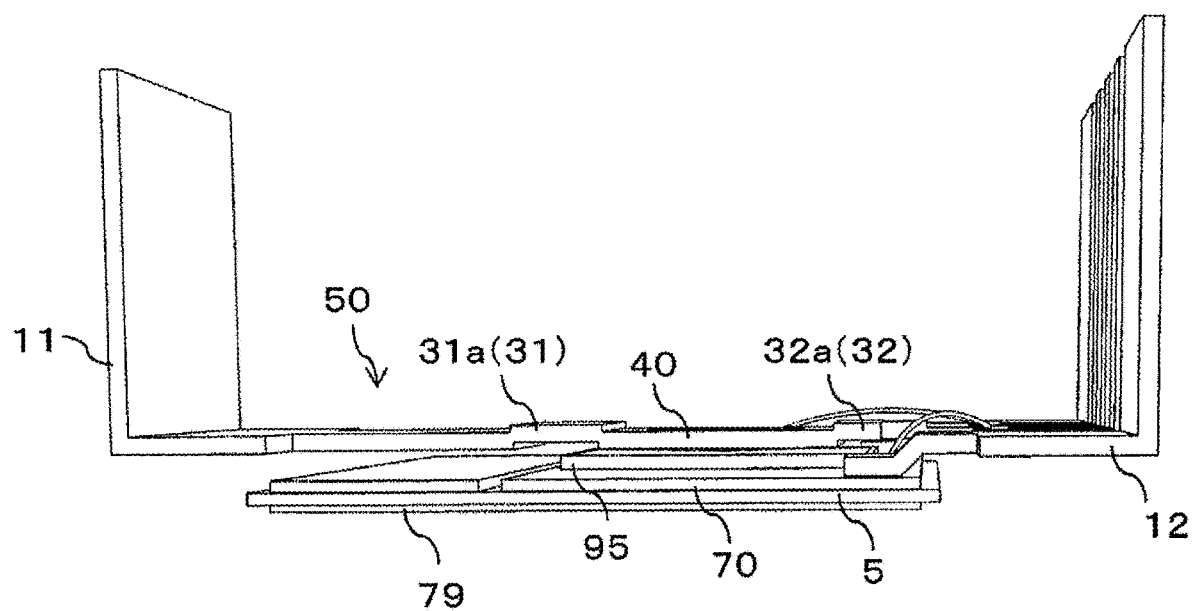
FIG. 3 is a side view of the aspect illustrated in FIG. 2 as seen from the side.

As illustrated in FIG. 3, the connection body 50 is in contact with the semiconductor element 95 only with the head part 40, and is provided apart from the substrate 5 in other portions, so that it is conceivable that the conductor layer 70 is not provided on the back surface side of the first main terminal 11. When such an aspect is adopted, a manufacturing cost can be reduced. Also, in a case where the first main terminal 11 and the head part 40 are integrally formed, it is possible to expose the terminal outward from the side surface of the sealing part 90 without intervention of the conductor layer 70, so that it is expected that a size in an in-plane direction is reduced because of absence of the conductor layer 70. It is also conceivable to adopt an aspect in which the substrate 5 itself is not provided on the back surface side of the first main terminal 11. When such aspect is adopted, it is possible to expect further reduction in manufacturing cost, and it is also possible to expect reduction in size in a planar direction of the semiconductor device.

In a case where the aspect in which the front surface side sensing terminal 13 and the connecting unit 35, and the first main terminal 11 are provided so as to extend in the opposite directions from the head part 40 as illustrated in FIG. 2 and the like is adopted, it is possible to perform positioning by the jigs 99 in a stable state. Therefore, it is possible to improve operation efficiency and to reduce the possibility that the head part 40 is erroneously inclined with respect to the front surface of the semiconductor element 95.

When an aspect in which the back surface side height of the first main terminal 11 corresponds to the back surface side height of the front surface side sensing terminal 13 is adopted as illustrated in FIGS. 6 to 8, operation of finely adjusting the jig 99 can be reduced, and it is possible to efficiently perform the positioning. It is also possible to reduce the possibility that the head part 40 is erroneously inclined with respect to the front surface of the semiconductor element 95. From the viewpoint of these effects, it is preferable that the difference between the back surface side height of the first main terminal 11 and the back surface side height of the front surface side sensing terminal 13 is not larger than 5% of the thickness $T_0$ or $T_1$, it is more preferable that this is not larger than 3% of the thickness $T_0$, and it is still more preferable that this is not larger than 1% of the thickness $T_0$ or $T_1$.

If the semiconductor element 95 has the withstand voltage structure, in a case where the avoiding parts 31 and 32 for avoiding contact with the withstand voltage structure are provided as illustrated in FIG. 2 and the like, it is possible to prevent electric contact of the withstand voltage structure of the semiconductor element 95 and the connection body 50. Also, in this aspect, in a case of adopting an aspect in which the head part 40 is integrally formed with the first main terminal 11, the connecting unit 35, and the front surface side sensing terminal 13 (which may include the avoiding parts 31 and 32), it is possible to prevent the height positions thereof from changing due to the coupling aspect thereof and to more accurately adjust the height by the jig 99 and the like.

In a case where the avoiding parts 31 and 32 have the first avoiding part 31 provided between the first main terminal 11 and the head part 40 and the second avoiding part 32 provided between the front surface side sensing terminal 13 and the head part 40, it is useful in that electrical contact with the withstand voltage structure provided over a full circle such as the guard ring can be more surely prevented.

In a case of adopting an aspect in which the first avoiding part 31 is the first concave part 31a and the second avoiding part 32 is the second concave part 32a, it is useful in that the back surface side height of the first main terminal 11 and the back surface side height of the front surface side sensing terminal 13 can more easily correspond to each other and the operation efficiency can be improved.

In a case of adopting the aspect in which the head part 40 has the first convex part 41 projecting toward the semiconductor element 95 as illustrated in FIG. 5 and the like, in a portion where the first convex part 41 is not provided, the thickness of the conductive adhesive 75 such as solder can be more surely made equal to or larger than a predetermined thickness. Meanwhile, the first convex part 41 may be in contact with the front surface of the semiconductor element 95 or not.

In a case where an aspect in which the head part 40 has the first convex part 41 and the second convex part 42 projecting toward the semiconductor element 95, a usage amount of the conductive adhesive 75 can be reduced, and further the second convex part 42 can also be used to secure the width of the current path.

<Manufacturing Method>

A manufacturing method for the semiconductor device having the above-described configuration is next described. Although detailed description is omitted because this will be repetitive description, in the manufacturing method for the semiconductor device, any aspect described in <Configuration> and <Action/Effect> described above can be adopted.

The connection body 50 having the sealing part 90, the first main terminal 11 being the first terminal for projecting outward from the first side surface of the sealing part 90, the front surface side sensing terminal 13 being the second terminal for projecting outward from the second side surface different from the first side surface of the sealing part 90, and the head part 40 coupled to the first main terminal 11 and the front surface side sensing terminal 13 and for being connected to the front surface of the semiconductor element 95 via the conductive adhesive 75 is prepared (preparing step).

Next, the conductive adhesive 75 is placed on the semiconductor element 95 placed on the conductor layer 70 on the substrate 5 (conductive adhesive placing step).

Next, the first main terminal 11 and the front surface side sensing terminal 13 are placed on the jigs 99 so that the head part 40 is connected to the front surface of the semiconductor element 95 via the conductive adhesive 75 (positioning step, refer to FIGS. 6 to 8). Thereafter, the conductive adhesive 75 is cured, and the connection body 50 is positioned on the semiconductor element 95 (conductive adhesive curing step).

Next, the semiconductor element 95, the conductor layer 70 and the like are covered with a metal mold, and the sealing resin is poured into the metal mold. After that, the sealing resin is cured (sealing resin curing step).

Next, various terminals such as the first main terminal 11, the second main terminal 12, the front surface side sensing terminal 13, the back surface side sensing terminal 14, and the control terminal 15 are cut at predetermined positions, and thereafter bent toward the front surface side (cutting/bending step, refer to FIG. 1).

In this manner, the semiconductor device as illustrated in FIG. 1 is manufactured.

Lastly, the description of the embodiment and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings, and the like.

REFERENCE SIGNS LIST

11 First terminal (first main terminal)
13 Second terminal (front surface side sensing terminal)
31 First avoiding part
31a First concave part (first avoiding part)
32 Second avoiding part
32a Second concave part (second avoiding part)
40 Head part
50 Connection body
75 Conductive adhesive
90 Sealing part
95 Semiconductor element (electronic element)

What is claimed is:

1. An electronic device comprising:
   a substrate;
   a conductor layer provided on the substrate;
   an electronic element provided on the conductor layer;
   a connection body connected to a front surface of the electronic element via a conductive adhesive; and
   a sealing part sealing the conductor layer and the electronic element inside;
   wherein the connection body has a head part connected to the front surface of the electronic element, a first terminal part integrally formed with the head part and extending away from the head part and projecting outward from the sealing part, and a second terminal part integrally formed with the head part and extending away from the head part in an opposite direction of the first terminal part and projecting outward from the sealing part, and
   wherein the first terminal part, the head part and the second terminal part are integrally formed in the connection body.

2. The electronic device according to claim 1,
   wherein the electronic element has a withstand voltage structure,
   the connection body has a first avoiding part, provided between the first terminal part and the head part, for avoiding contact with the withstand voltage structure, and a second avoiding part, provided between the second terminal part and the head part, for avoiding contact with the withstand voltage structure.

3. The electronic device according to claim 2,
   wherein the first avoiding part is a first concave part concaved so as to be separated from the electronic element and
   wherein the second avoiding part is a second concave part concaved so as to be separated from the electronic element.

4. The electronic device according to claim 1,
   wherein a back surface side height of the first terminal part is at a same height as a back surface side height of the second terminal part.

5. A connection body, used for an electronic device having a substrate, a conductor layer provided on the substrate, an electronic element provided on the conductor layer and a sealing part sealing the conductor layer and the electronic element inside, and connected to a front surface of the electronic element via a conductive adhesive, comprising:
   a head part connected to the front surface of the electronic element;
   a first terminal part integrally formed with the head part and extending away from the head part and projecting outward from the sealing part; and
   a second terminal part integrally formed with the head part and extending away from the head part in an opposite direction of the first terminal part and projecting outward from the sealing part, and
   wherein the first terminal part, the head part and the second terminal part are integrally formed.

* * * * *